(12) United States Patent
Zito et al.

(10) Patent No.: US 9,276,386 B2
(45) Date of Patent: Mar. 1, 2016

(54) SINGLE LAYER LEADFRAME WITH INTEGRATED THREE-ROW CONNECTOR

(71) Applicant: Continental Automotive Systems, Inc., Auburn Hills, MI (US)

(72) Inventors: Donald J Zito, Fox River Grove, IL (US); Valentin M Stefaniu, Lake Zurich, IL (US); Gabriel Tirlea, Niles, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/497,849

(22) Filed: Sep. 26, 2014

(65) Prior Publication Data

US 2015/0011101 A1 Jan. 8, 2015

Related U.S. Application Data

(63) Continuation-in-part of application No. 13/768,415, filed on Feb. 15, 2013, now Pat. No. 8,905,791.

(51) Int. Cl.
| | |
|---|---|
| *H01R 31/06* | (2006.01) |
| *H02B 1/01* | (2006.01) |
| *B60T 8/36* | (2006.01) |
| *G06F 1/18* | (2006.01) |
| *H01R 9/22* | (2006.01) |
| *H05K 7/02* | (2006.01) |
| *H05K 5/00* | (2006.01) |

(52) U.S. Cl.
CPC ... *H02B 1/01* (2013.01); *B60T 8/36* (2013.01); *G06F 1/18* (2013.01); *H01R 9/226* (2013.01); *H05K 5/0069* (2013.01); *H05K 7/026* (2013.01); *B60T 8/3675* (2013.01)

(58) Field of Classification Search
CPC ... H01R 23/025; H01R 13/6658; H01R 31/06
See application file for complete search history.

(56) References Cited

U.S. PATENT DOCUMENTS

| | | | | |
|---|---|---|---|---|
| 4,395,084 | A * | 7/1983 | Conrad | 439/331 |
| 4,449,165 | A | 5/1984 | Kaufman | |
| 4,820,192 | A * | 4/1989 | Denkmann et al. | 439/404 |
| 5,406,450 | A * | 4/1995 | Shieh | 361/679.37 |
| 6,485,112 | B1 * | 11/2002 | Haller | 303/119.2 |
| 7,473,107 | B2 | 1/2009 | Ice | |
| 7,540,747 | B2 * | 6/2009 | Ice et al. | 439/79 |
| 7,756,610 | B2 * | 7/2010 | Laurent et al. | 700/302 |
| 8,149,594 | B2 * | 4/2012 | Nishihata | 361/818 |
| 8,375,901 | B2 * | 2/2013 | Krajowsky et al. | 123/60.1 |
| 2003/0176109 | A1 * | 9/2003 | Fukuchi et al. | 439/638 |
| 2004/0043660 | A1 * | 3/2004 | Brown et al. | 439/608 |
| 2004/0187942 | A1 * | 9/2004 | Ford et al. | 137/884 |

(Continued)

*Primary Examiner* — Gary Paumen

(57) ABSTRACT

A lead frame assembly having a lead frame made of a single layer, a housing substantially surrounding the lead frame, and a plurality of leads formed as part of the lead frame. The lead frame assembly also includes a plurality of interfaces, allowing various devices to interact with the lead frame, such as sensors, thermistors, solenoids, engine controllers, or electronic control units, or the like. The interfaces may be formed as part of the lead frame, oriented in different directions, and may be located in different planes, making the lead frame assembly suitable for applications with different packaging requirements. The interfaces may be a plurality of connectors, where one of the connectors has multiple rows of pins which are in communication with the rest of the connectors, facilitating the communication between the connector and various devices.

26 Claims, 4 Drawing Sheets

(56) References Cited

U.S. PATENT DOCUMENTS

| | | |
|---|---|---|
| 2007/0184722 A1* | 8/2007 | Doherty .................. 439/638 |
| 2009/0142940 A1* | 6/2009 | Ikeda ..................... 439/76.2 |
| 2009/0223468 A1* | 9/2009 | Smith et al. ............ 123/90.13 |
| 2010/0035454 A1* | 2/2010 | Morgan et al. ............ 439/296 |
| 2010/0048058 A1* | 2/2010 | Morgan et al. ........ 439/607.05 |
| 2010/0105251 A1* | 4/2010 | Hiew et al. ................ 439/638 |
| 2011/0089546 A1 | 4/2011 | Bayan |
| 2015/0171565 A1* | 6/2015 | Gomez .................. H01R 27/02 439/76.1 |
| 2015/0244119 A1* | 8/2015 | Wu ....................... H01R 24/62 439/638 |

\* cited by examiner

10 # SINGLE LAYER LEADFRAME WITH INTEGRATED THREE-ROW CONNECTOR

CROSS-REFERENCE TO RELATED APPLICATIONS

This application is a continuation-in-part application, which claims the benefit of U.S. application Ser. No. 13/768,415 filed Feb. 15, 2013. The disclosure of the above application is incorporated herein by reference.

FIELD OF THE INVENTION

The invention relates generally to multiple sub-lead frames being associated with a connector having multiple rows of pins, and each sub-lead frame has at least one pin that is in electrical communication with one or more of the rows of pins that are part of the connector.

BACKGROUND OF THE INVENTION

Lead frames are commonly used to provide electrical communication between various electrical components. The lead frame typically includes metal leads which extend outside of a housing for providing a connection between various components.

Lead frames also may include a connector, which is mounted to the housing, for providing electronic communication between the lead frame and other devices. There are also applications where is it necessary to have multiple connectors either formed as part of the lead frame, or attached to the lead frame. One type of a design incorporates the use of a lead frame having multiple layers, to provide for the use of multiple connectors. Still other applications require the use of a single connector which is in electrical communication with multiple connectors that are part of the lead frame having multiple layers. These multiple layer lead frames are typically constructed using a housing surrounding the multiple layers, with the multiple layers being separated by a portion of the housing. One of the issues that may occur during manufacturing of these types of lead frames is electrical shorts occurring as a result from mechanical slivers from plating or from the mold inserts closing on the stamping and dislodging the slivers from the edge of the stamping. Additionally, lead frames having multiple layers are more expensive to manufacture because of the multiple pre-molds required for the additional layers.

Accordingly, there exists a need for a lead frame which allows for the use of multiple connectors, as well as multiple lead frames having a layered structure, while remaining cost feasible to manufacture.

SUMMARY OF THE INVENTION

The present invention is a lead frame assembly having several sub-lead frames, each of which is in electrical communication with a single connector, providing electrical communication with several components using the single connector. The lead frame assembly includes a first sub-lead frame and a second sub-lead frame, where at least part of each of the first and second sub-lead frames is in a first plane, and a third sub-lead frame, which is partially disposed in a second plane. A housing substantially surrounds a portion of each of the sub-lead frames, and an upper connector is integrally formed as part of the housing.

A plurality of leads are formed as part of the first sub-lead frame and the second sub-lead frame, and in one embodiment, each of the plurality of leads is connected to a solenoid.

The lead frame assembly also includes a plurality of sub-connectors, where a portion of the plurality of sub-connectors are part of the first sub-lead frame, a portion of the plurality of sub-connectors are part of the second sub-lead frame, and a portion of the plurality of sub-connectors are part of the third sub-lead frame.

Each of the sub-connectors in is electrical communication with an upper connector having multiple rows of pins. The upper connector extends from the first plane outwardly away from the first sub-lead frame and the second sub-lead frame. The upper connector includes a first row of pins, a second row of pins, and a third row of pins located between the first row of pins and the second row of pins. At least a portion of the first and second rows of pins is part of each of the first sub-lead frame and the second sub-lead frame, and at least a portion of the third row of pins is part of the third sub-lead frame. Additionally, a portion of the second row of pins is in electrical communication with one or more of the plurality of leads.

The plurality of sub-connectors also includes varying amounts of pins in electrical communication with one or more of the rows of pins of the upper connector, and the pins are exposed outside of the housing for connection with electronic devices.

The first sub-lead frame includes three sub-connectors located in the first plane and in electrical communication with at least a portion of the first row of pins, the second sub-lead frame includes a sub-connector located in the first plane and in electrical communication with at least a portion of the first row of pins, and the third sub-lead frame includes two sub-connectors located in the second plane, and in electrical communication with at least a portion of the third row of pins.

It is an object of this invention to provide a lead frame assembly which may be used with several different devices, such as, but not limited to sensors, thermistors, solenoids, engine controllers, or electronic control units, or any other device suitable for connection with a lead frame using one or more interfaces or connectors. In one embodiment, the interfaces are located in different planes, allowing for the connection to the lead frame to be in different planes.

It is another object of this invention to provide a lead frame having a single layer to incorporate a three-row connector system. In one embodiment, the additional third row is added to the center of a dual row connector. This third center row is part of a separate sub-lead frame incorporated into the lead frame assembly, and assembled on the bottom side of the lead frame assembly.

It is another object of this invention to provide a three-row connector incorporated into a single layer lead frame. This provides a cost effective solution for two-row connectors and potential expansion to three-row connectors at minimal costs. The lead frame assembly of the present invention also expands the connector ports and interconnectors on the lead frame. Connectors having a low pin count are used with the basic lead frame, while connectors having a high pin count may add expansion to the lead frame and add the third row. The three-row connector may be used for providing a single interface to communicate with many sub-connectors that are connected to various components.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

An embodiment of a lead frame assembly according to the present invention is shown in FIGS. 1-5 generally at 10. The lead frame assembly 10 includes a frame portion, or lead frame, 12 having a plurality of leads 14. The lead frame 12 in this embodiment includes several sub-lead frames. There is a first sub-lead frame, shown generally at 12A, a second sub-lead frame, shown generally at 12B, and a third sub-lead frame, shown generally at 12C, with a portion of the leads 14 being part of the first sub-lead frame 12A and the second sub-lead frame 12B. The lead frame 12 and leads 14 are at least partially surrounded by a housing 16. The housing 16 is molded around the lead frame 12 and leads 14, and is made of a plastic moldable material, such as epoxy, nylon, polyethylene, or polystyrene.

The sub-lead frames 12A,B are made of a single layer, shown generally at 18A, where the single layer 18A defines a first plane. Integrally formed as part of the housing 16 is more than one interface. Each interface is used for allowing communication as well as a connection with the lead frame 12. In this embodiment, the plurality of interfaces is a plurality of connectors. However, other types of interfaces may be used to allow the lead frame 12 to be used with different devices, such as, but not limited to, thermistors, solenoids, sensors, or the like. Furthermore, the other devices, such as the sensors, thermistors, solenoids, engine controllers, or electronic control units, may be directly connected to the lead frame 12, and in other embodiments, the other devices may be integral with the lead frame 12.

Figure 1:
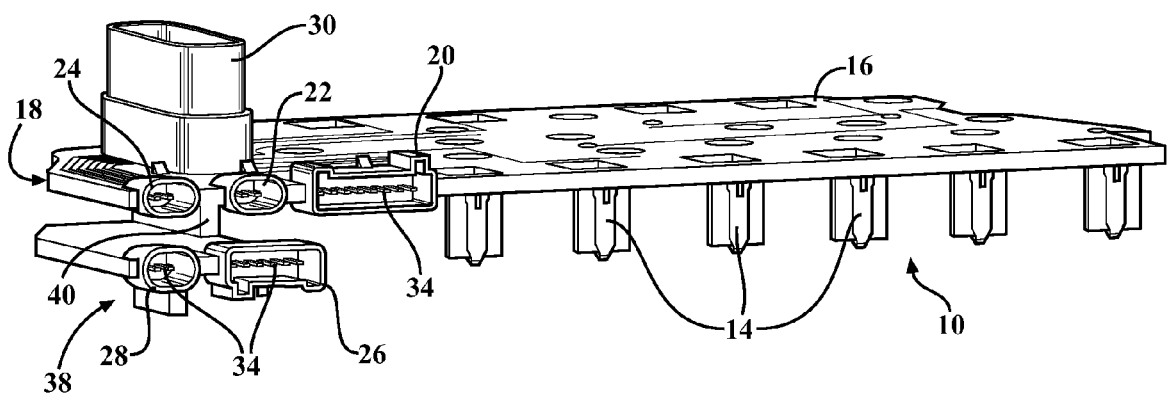
FIG. 1 is a perspective view of a lead frame having multiple connectors, according to embodiments of the present invention.
Figure 2:
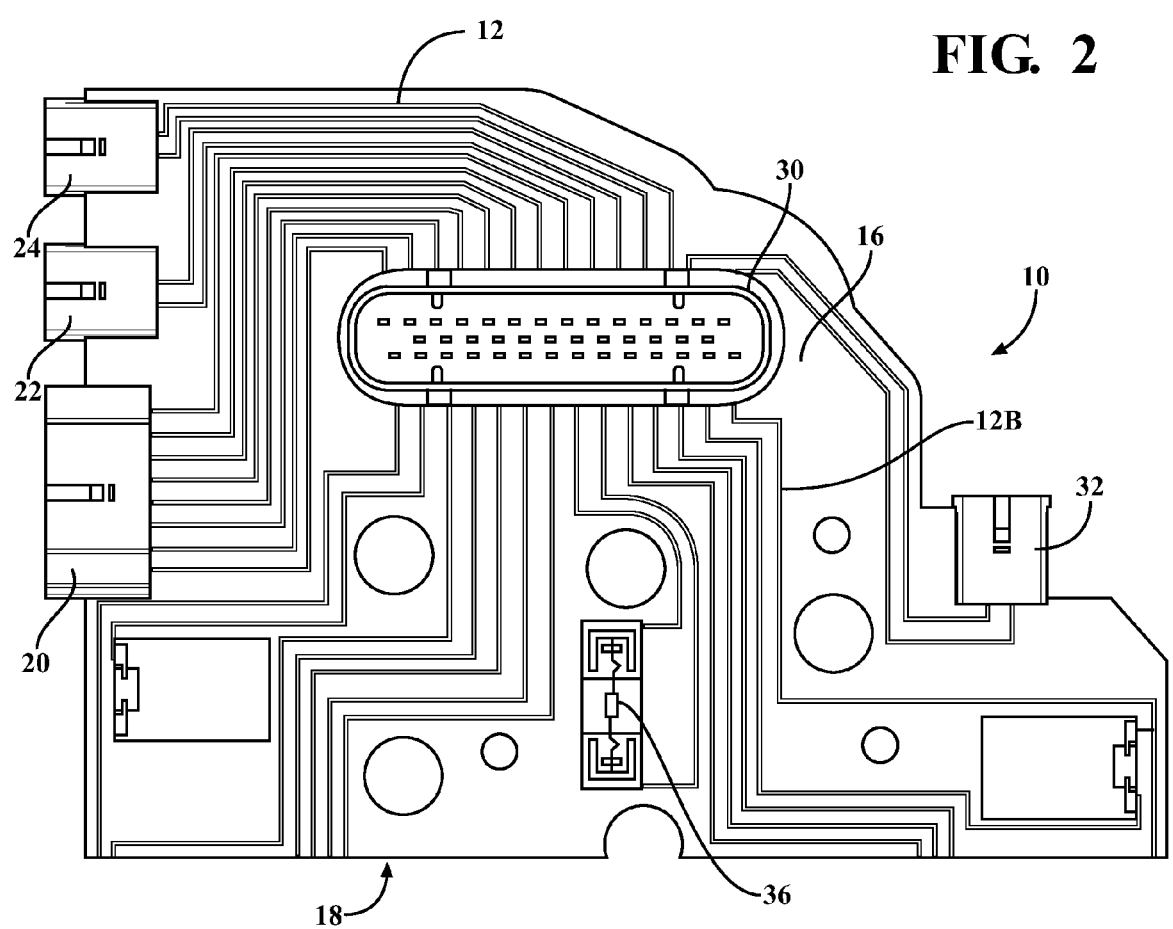
FIG. 2 is a top view of a portion of a lead frame having multiple connectors, according to embodiments of the present invention.
Figure 5:
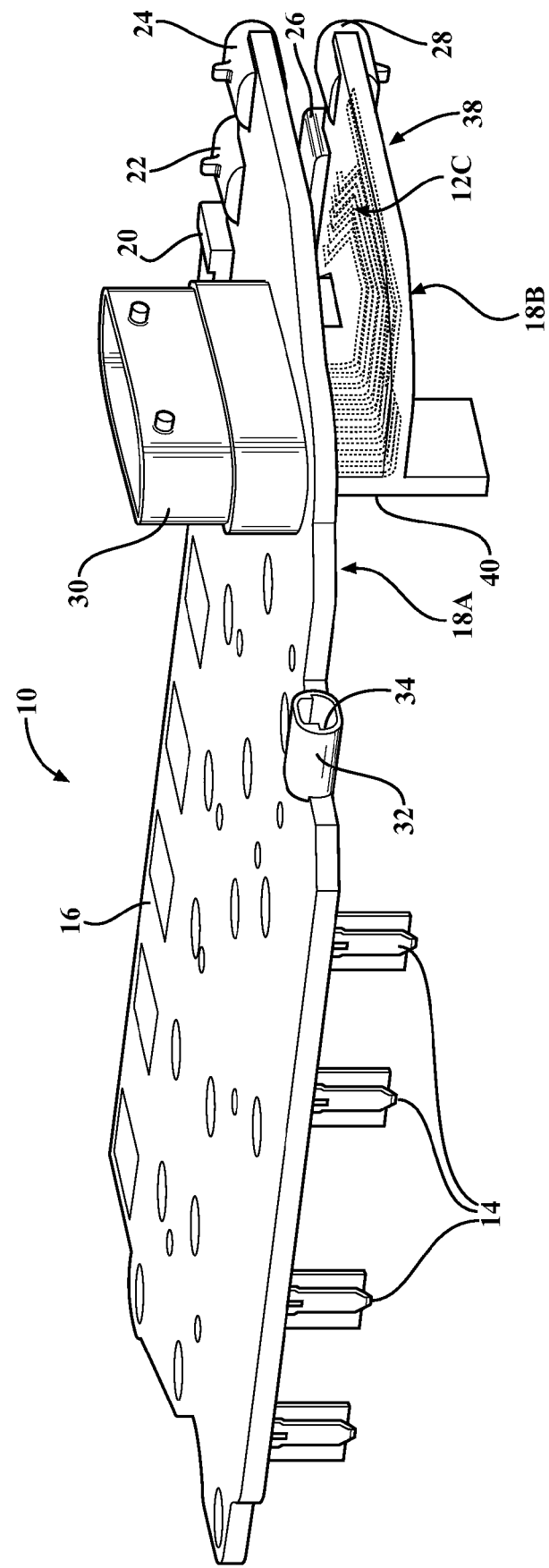
FIG. 5 is a second perspective view of a lead frame having multiple connectors, according to embodiments of the present invention.

In the embodiment shown in FIGS. 1-5, there is a first connector 20, a second connector 22, and a third connector 24, which are integral with the housing 16, and the connectors 20,22,24 and layer 18A are located in the first plane 18A. The connectors 20,22,24 are associated with the first sub-lead frame 18A. There is also a fourth connector 26 and a fifth connector 28 associated with the third sub-lead frame 12C, and the housing 16 partially surrounds the fourth connector 26 and the fifth connector 28. The fourth connector 26 and fifth connector 28 are located in a second plane, shown generally at 18B, which is substantially parallel to and separate from the first plane 18A. In this embodiment, the fourth connector 26 and fifth connector 28 are located below the connectors 20,22,24. A sixth connector, which in this embodiment is an upper connector 30, is associated with all three sub-lead frames 12A,B,C, and is at least partially surrounded by the housing 16. The sixth connector 30 faces and extends outwardly away from the lead frame 12, on the opposite side as the fourth sub-connector 26 and fifth sub-connector 28, as shown in FIGS. 1, 2, and 5. There is also a seventh connector 32, which is shown in FIG. 2 and associated with the second-lead frame 12B. The seventh connector 32 is located in the first plane 18A.

The connectors 20,22,24,26,28,32 in this embodiment are all sub-connectors, and are all in electrical communication with the upper connector 30. Each of the connectors 20,22, 24,26,28,30,32 also includes one or more pins 34 which are in electrical communication with the lead frame 12, which therefore provide electrical communication between the components connected to the connectors 20,22,24,26,28,30, 32 and the lead frame 12. Some of the connectors 20,22,24, 26,28,30,32 have a greater number of pins (a high pin count), and other connectors 20,22,24,26,28,30,32 have a lesser number of pins (a low pin count), depending upon the use for the connectors 20,22,24,26,28,30,32.

Figure 3:
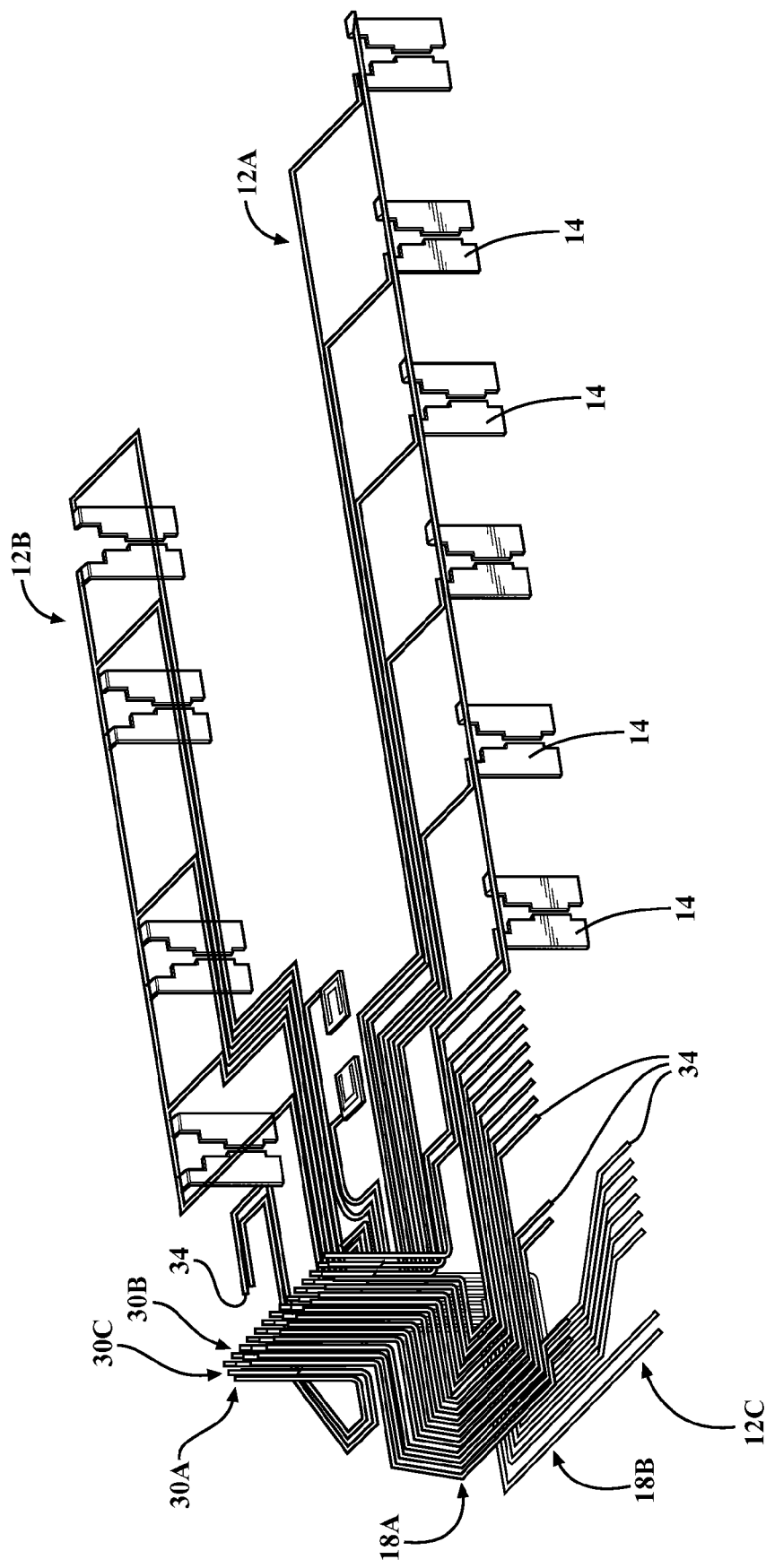
FIG. 3 is a perspective view of a lead frame assembly with the housing and the shroud for each connector removed, according to embodiments of the present invention.
Figure 4:
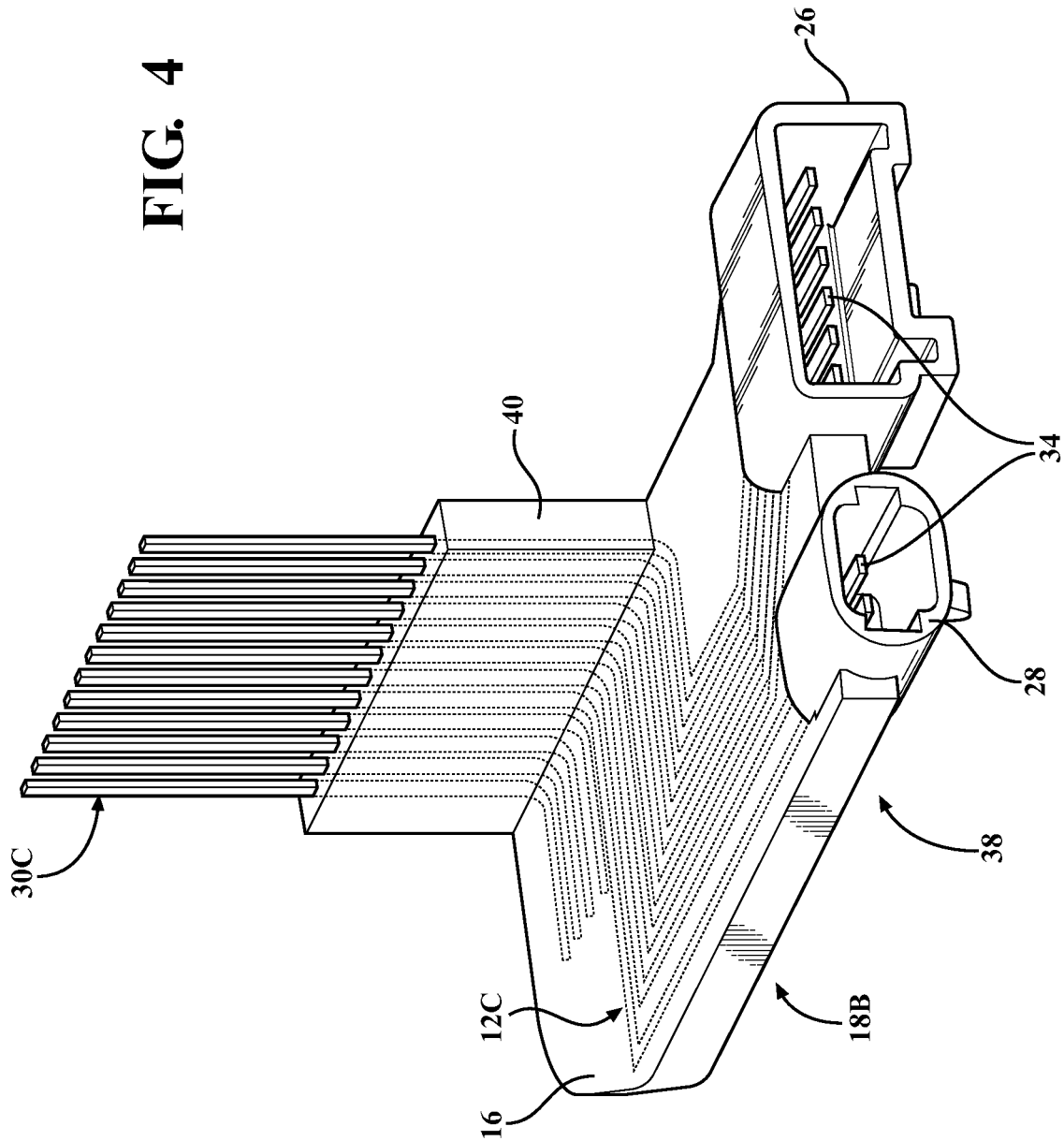
FIG. 4 is a perspective view of a sub-assembly, which is part of a lead frame assembly, according to embodiments of the present invention.

More specifically, the upper connector 30 is a three-row connector 30, and includes a first row of pins, shown generally at 30A, a second row of pins, shown generally at 30B, and a third row of pins, shown generally at 30C. Referring now to FIGS. 2-3, the first row 30A of pins 34 has fourteen pins, and it is shown that the pins 34 for the first three connectors 20,22,24 of the first sub-lead frame 12A are associated with twelve of the pins 34 in the first row 34A of pins 34 of the upper connector 30. Two of the pins 34 in the first row 30A are associated with the pins 34 of the seventh connector 32 of the second sub-lead frame 12B.

The second row 30B of pins 34 of the upper connector 30 includes fourteen pins 34, seven of which are associated with the leads 14 of the first sub-lead frame 12A, five of which are associated with the leads 14 of the second sub-lead frame 12B, and two of which are associated with a thermistor 36, which is located in the first plane 18A and part of the second sub-lead frame 12B. The third row 30C of pins 34 of the upper connector 30 are associated with the pins 34 of the fourth connector 26 and fifth connector 28.

The connectors 20,22,24,26,28,30,32 and leads 14 are used for connecting the assembly 10 to various components. In addition to having other types of interfaces than the connectors 20,22,24,26,28,30,32, the connectors 20,22,24,26,28,30, 32 may be used for providing a connection between the lead frame 12, and various components such as sensors, solenoids, thermistors, and the like. In one embodiment, the lead frame assembly 10 is used as part of a transmission. Each of the leads 14 may be used for connection to a corresponding solenoid, and each of the first three connectors 20,22,24 may be used for connection with other parts of the transmission. Also, each of the remaining connectors 26,28,30,32 may be used to connect to components outside the transmission, such as an engine controller, a vehicle electronic control unit, or the like. Various components may also be mounted to the lead frame 12, such as resistors, capacitors, one or more inductors, or as shown in FIG. 2, the thermistor 36.

The use of the three rows 30A,B,C as part of the upper connector 30 provides the additional functionality of being able to add the third sub-lead frame 12C to the first and second sub-lead frames 12A,B, without having to add an additional connector. More specifically, the design of the lead frame assembly 10 allows for a single corresponding connector to be connected to the upper connector 30 and therefore be in electrical communication with all of the connectors 20,22,24, 26,28,32 and the leads 14 of all three sub-lead frames 12A, 12B,12C. The upper connector 30 being a three-row connector having additional pins 34 therefore expands the use of the lead frame assembly 10 beyond the use of the two sub-lead frames 12A,12B having the connectors 20,22,24,32, to having the additional connectors 26,28, providing the lead frame assembly 10 with additional capability, without having to add another connector to supplement the upper connector 30.

While is has been shown that the pins 34 in each of the rows 30A,30B,30C are associated with the various pins 34 of the connectors 20,22,24,26,28,32 and leads 14, as previously described, it is within the scope of the invention that the pins 34 of the connector 30 may be configured differently, and each row 30A,30B,30C may have different pins 34 associated with different connectors 20,22,24,26,28,32 and leads 14, without departing from the scope of the invention.

Referring again to the Figures generally, in one embodiment, the fourth connector 26 and the fifth connector 28 are grouped together as a cluster, shown generally at 38. The cluster 38 is connected to the lead frame 12 through the use of an extension 40. The extension 40 provides a connection between the portion of the housing 16 which supports the connectors 26,28 located in the second plane 18B and the portion of the housing 16 located in the first plane 18A. In other embodiments, the connectors 26,28 are not arranged in a cluster, but are located in separate locations, and there is a separate extension for each connector 26,28, which is used to support each connectors 26,28.

Various molding techniques may be used to integrally form the housing 16 with the lead frame 12. The housing 12 is molded around the lead frame 12, while still allowing the pins 34 and the leads 14 to remain exposed for connection with the various components as mentioned above. The lead frame 12 may also include die attach pads which are used for supporting the lead frame 12 during assembly.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
 a lead frame assembly, including:
  a plurality of sub-lead frames;
  a housing surrounding at least part of each of the plurality of sub-lead frames;
  an upper connector connected to the housing and in electrical communication with the plurality of sub-lead frames;
  a plurality of sub-connectors, each of the plurality of sub-connectors being part of one of the plurality of sub-lead frames; and
  a plurality of pins, a portion of the plurality of pins being part of the upper connector and in electrical communication with another portion of the plurality of pins being part of each of the plurality of sub-connectors;
  wherein a portion of at least one of the sub-lead frames is located in a first plane such that at least one of the plurality of sub-connectors is located in the first plane, and a portion of another of the plurality of sub-lead frames is located in a second plane such that another of the plurality of sub-connectors is located in the second plane.

2. The apparatus of claim 1, the plurality of pins further comprising:
 a first row of pins being part of the upper connector;
 a second row of pins being part of the upper connector; and
 a third row of pins being part of the upper connector;
 wherein at least a portion of the first row of pins and the second row of pins are part of one of the plurality of sub-lead frames, and at least a portion of the third row of pins are part of another of the plurality of sub-lead frames.

3. The apparatus of claim 2, wherein the third row of pins is located between the first row of pins and the second row of pins.

4. The apparatus of claim 2, the plurality of sub-lead frames further comprising:
 a first sub-lead frame, a portion of the first sub-lead frame disposed in the first plane;
 a second sub-lead frame, a portion of the second sub-lead frame disposed in the first plane; and
 a third sub-lead frame, a portion of the third sub-lead frame disposed in the second plane;
 wherein the first sub-lead frame and the second sub-lead frame include at least a portion of the first row of pins and a portion of the second row of pins, and the third sub-lead frame includes at least a portion of the third row of pins.

5. The apparatus of claim 4, the first sub-lead frame further comprising at least one of the plurality of sub-connectors located in the first plane and in electrical communication with the first row of pins.

6. The apparatus of claim 4, the second sub-lead frame further comprising at least one of the plurality of sub-connectors located in the first plane, and in electrical communication with the first row of pins.

7. The apparatus of claim 4, the third sub-lead frame further comprising at least one of the plurality of sub-connectors located in the second plane, and in electrical communication with the third row of pins.

8. The apparatus of claim 4, wherein the upper connector extends from the first plane outwardly away from the lead frame on the opposite side of the first sub-lead frame and the second sub-lead frame in relation to the third sub-lead frame.

9. The apparatus of claim 2, further comprising a plurality of leads, wherein at least a portion of the second row of pins is in electrical communication with one or more of the plurality of leads.

10. The apparatus of claim 9, wherein each of the plurality of leads is in electrical communication with a solenoid.

11. A lead frame assembly, comprising:
 a plurality of sub-lead frames, at least one of the plurality of sub-lead frames disposed in a first plane, and at least one of the plurality of sub-lead frames disposed in a second plane;
 a housing surrounding at least part of each of the plurality of sub-lead frames;
 an upper connector connected to the housing and in electrical communication with the plurality of sub-lead frames;
 a plurality of sub-connectors, each of the plurality of sub-connectors being part of one of the plurality of sub-lead frames;
 a plurality of pins, a portion of the plurality of pins being part of the upper connector and in electrical communication is another portion of the plurality of pins being part of each of the plurality of sub-connectors;
 a first row of pins being part of the upper connector, the first row of pins being part of the plurality of pins;

a second row of pins being part of the upper connector, the second row of pins being part of the plurality of pins;

a third row of pins being part of the upper connector, the third row of pins being part of the plurality of pins, the third row of pins being located between the first row of pins and the second row of pins; and a plurality of leads, at least a portion of the second row of pins being in electrical communication with one or more of the plurality of leads;

wherein at least a portion of the first row of pins and the second row of pins are part of one of the plurality of sub-lead frames, and at least a portion of the third row of pins is part of another of the plurality of sub-lead frames.

12. The lead frame assembly of claim 11, the plurality of sub-lead frames further comprising a first sub-lead frame having a portion disposed in the first plane, a portion of the first row of pins and a portion of the second row of pins being part of the first sub-lead frame.

13. The lead frame assembly of claim 12, the first sub-lead frame further comprising three sub-connectors located in the first plane and in electrical communication with at least a portion of the first row of pins.

14. The lead frame assembly of claim 11, the plurality of sub-lead frames further comprising a second sub-lead frame having a portion disposed in the first plane, a portion of the first row of pins and a portion of the second row of pins being part of the second sub-lead frame.

15. The lead frame assembly of claim 14, the second sub-lead frame further comprising a sub-connector located in the first plane, and in electrical communication with at least a portion of the first row of pins.

16. The lead frame assembly of claim 11, the plurality of sub-lead frames further comprising a third sub-lead frame having a portion disposed in the second plane, at least a portion of the third row of pins being part of the third sub-lead frame.

17. The lead frame assembly of claim 16, the third sub-lead frame further comprising two sub-connectors located in the second plane, and in electrical communication with at least a portion of the third row of pins.

18. The lead frame assembly of claim 11, wherein the upper connector extends outwardly away from the lead frame, and the upper connector extends from the first plane.

19. The lead frame assembly of claim 18, wherein each of the plurality of leads is connected to a solenoid.

20. A lead frame assembly, comprising:
a first sub-lead frame, a portion of the first sub-lead frame disposed in a first plane;
a second sub-lead frame, a portion of the second sub-lead frame disposed in the first plane;
a third sub-lead frame, a portion of the third sub-lead frame disposed in a second plane;
a housing substantially surrounding a portion of the first sub-lead frame, the second sub-lead frame, and the third sub-lead frame;
an upper connector, at portion of the upper connector integrally formed as part of the housing;
a plurality of leads formed as part of the first sub-lead frame and the second sub-lead frame;
a plurality of sub-connectors, a portion of the plurality of connectors being part of the first sub-lead frame, a portion of the plurality of sub-connectors being part of the second sub-lead frame, and a portion of the plurality of sub-connectors being part of the third sub-lead frame;
a first row of pins being part of the upper connector;
a second row of pins being part of the upper connector, at least a portion of the second row of pins being in electrical communication with one or more of the plurality of leads; and
a third row of pins being part of the upper connector, the third row of pins being disposed between the first row of pins and the second row of pins;
wherein at least a portion of the first row of pins and the second row of pins are part of the first sub-lead frame, and at least a portion of the third row of pins is part of the second sub-lead frame.

21. The lead frame assembly of claim 20, the plurality of sub-connectors further comprising a plurality of pins exposed outside of the housing for connection with electronic devices, each of the plurality of sub-connectors having one or more of the plurality of pins in electrical communication with one or more of the first row of pins, the second row of pins, or the third row of pins.

22. The lead frame assembly of claim 21, the first sub-lead frame further comprising three sub-connectors located in the first plane and in electrical communication with at least a portion of the first row of pins.

23. The lead frame assembly of claim 21, the third sub-lead frame further comprising two sub-connectors located in the second plane, and in electrical communication with at least a portion of the third row of pins.

24. The lead frame assembly of claim 21, the second sub-lead frame further comprising a sub-connector located in the first plane, and in electrical communication with at least a portion of the first row of pins.

25. The lead frame assembly of claim 20, wherein the upper connector extends outwardly away from the lead frame, and the upper connector extends from the first plane.

26. The lead frame assembly of claim 20, wherein each of the plurality of leads is connected to a solenoid.

* * * * *